(12) United States Patent
Fujiwara et al.

(10) Patent No.: US 6,794,022 B2
(45) Date of Patent: Sep. 21, 2004

(54) METAL PLATE COATED WITH LUBRICATING RESIN AND DRILLING PROCESSING METHOD OF PRINTED WIRING BOARD USE THEREOF

(75) Inventors: Naoya Fujiwara, Kobe (JP); Eiichiro Yoshikawa, Kobe (JP); Hiroshi Kawai, Chiba (JP); Mikio Ono, Chiba (JP); Yasuhiro Okamura, Chiba (JP)

(73) Assignees: Kabushiki Kaisha Kobe Seiko Sho, Kobe (JP); Sun Aluminum Industries Co., Ltd., Chiba (JP)

( * ) Notice: Subject to any disclaimer, the term of this patent is extended or adjusted under 35 U.S.C. 154(b) by 278 days.

(21) Appl. No.: 09/826,900

(22) Filed: Apr. 6, 2001

(65) Prior Publication Data
US 2002/0037400 A1 Mar. 28, 2002

(30) Foreign Application Priority Data

Apr. 6, 2000 (JP) ........................ 2000-104882
Mar. 30, 2001 (JP) ........................ 2001-102670

(51) Int. Cl.$^7$ ............................ B32B 7/02; B32B 15/08; B32B 15/10; B23B 39/00; B23B 35/00
(52) U.S. Cl. ........................ 428/217; 428/416; 428/458; 428/461; 428/933; 408/1 R; 408/72 R; 408/87
(58) Field of Search ........................ 174/250, 251, 174/252, 253, 254, 255, 256, 257, 258, 259, 260, 261, 262, 263, 264, 265, 266, 267, 268; 428/213, 216, 217, 461, 416, 933, 458, 459; 408/1 R, 72 R, 87; 361/748, 750, 751, 702, 703, 704, 705, 706, 707, 708, 709, 710, 711; 29/840, 841, 842, 843, 844, 845, 846, 847, 848, 849, 850, 851, 852, 853, 854, 855

(56) References Cited

U.S. PATENT DOCUMENTS

| | | | | |
|---|---|---|---|---|
| 3,360,425 A | * | 12/1967 | Boone | ........................ 428/418 |
| 3,917,555 A | * | 11/1975 | Worschech et al. | ......... 524/298 |
| 4,781,495 A | | 11/1988 | Hatch et al. | ................. 408/112 |
| 4,929,370 A | | 5/1990 | Hatch et al. | ................ 252/12.2 |
| 5,059,492 A | * | 10/1991 | Shindou et al. | ............. 428/625 |
| 5,214,091 A | * | 5/1993 | Tanaka et al. | ............... 524/425 |
| 5,354,622 A | * | 10/1994 | Nakamaru et al. | ........... 428/551 |
| 5,399,192 A | * | 3/1995 | Yamasoe | ................. 106/190.1 |

FOREIGN PATENT DOCUMENTS

| | | | |
|---|---|---|---|
| JP | 63-091193 | * | 4/1988 |
| JP | 4-92488 | | 3/1992 |
| JP | 4-92489 | | 3/1992 |
| JP | 4-92490 | | 3/1992 |
| JP | 4-92491 | | 3/1992 |
| JP | 4-92492 | | 3/1992 |
| JP | 4-92493 | | 3/1992 |
| JP | 4-92494 | | 3/1992 |
| JP | 5-169400 | | 7/1993 |
| JP | 6-344297 | | 12/1994 |
| JP | 8-197496 | | 8/1996 |
| JP | 61-195196 A | * | 8/1996 |
| JP | 10-6298 | | 1/1998 |
| JP | 10-330777 | | 12/1998 |

* cited by examiner

Primary Examiner—Paul Thibodeau
Assistant Examiner—Kevin R. Kruer
(74) Attorney, Agent, or Firm—Oblon, Spivak, McClelland, Maier & Neustadt, P.C.

(57) ABSTRACT

A metal plate coated with a lubricating resin is coated with a lubricating resin having a modified polyamide (①) and a crosslinking curing agent (②) of the modified polyamide (①) on at least one side face of the metal plate. At this time, the compounding ratio of the modified polyamide (①) and the above-described crosslinking curing agent (②) is preferably (60:40) to (15:85) by mass ratio converted to solid content. Furthermore, according to requirement, an inorganic powder filler (③) may be added to the resin composition.

53 Claims, No Drawings

METAL PLATE COATED WITH LUBRICATING RESIN AND DRILLING PROCESSING METHOD OF PRINTED WIRING BOARD USE THEREOF

BACKGROUND OF THE INVENTION

1. Field of the Invention

The present invention relates to a metal plate coated with a lubricating resin which is preferable as a patch board for protection in order to efficiently carry out in the small hole drilling process of a printed wiring board, and the drilling processing method of the printed wiring board.

2. Description of the Related Art

When through holes are formed by a drill on a laminated printed wiring board in which a metal foil such as copper or the like is laminated on an insulator, a method of carrying out drilling processing by a drill by arranging a water-soluble lubricating immersion sheet on one side or both sides of the above-described laminated substrate and using the sheet as a patch board is disclosed in U.S. Pat. No. 4,781,495 and U.S. Pat. No. 4,929,370. The lubricating immersion sheet used in the method of forming the through holes is obtained by immersing a mixture of glycols such as diethylene glycol, dipropylene glycol, and the like which is a solid water-soluble lubricant, synthetic waxes such as a fatty acid and the like and nonionic surfactants in a porous material such as paper.

On the other hand, a method of drilling by a drill by using a water-soluble matrix polymer of a polyethylene glycol and a polypropylene glycol or a fatty acid ester derivative thereof alone, or a mixture thereof, and arranging a sheet in which the above-described polymer layer is formed, is disclosed (Japanese Patent Application Laid-Open No.4-92488, No.4-92489, No.4-92490, No.4-92491, No.4-92492, No.4-92493, No.4-92494).

Furthermore, a method of using a polyvinyl pyrrolidone, a gum arabic, a poly(sodium acrylate), sodium alginate, a carboxymethyl cellulose derivative, a polyether ester, a polyethylenepolypropylene glycol tolylene diisocyanate copolymer, a mixture of a specified polyalkylene oxide, a specified dicarboxylic acid compound and a diisocyanate compound, and a resin obtained by reacting a copolymer derived from a specified vinyl compound with a dibasic oxygen acid which contains a polyoxyethylene group as another water-soluble matrix polymer, is disclosed (Japanese Patent Application Laid-Open No.5-169400, No.6-344297, No.8-197496, No.10-6298 and No.10-330777).

However, these methods had defects in that although there is surely an effect of prevention of heat caused by a drill and effects of the reduction of roughness of the inner wall of the drilled part of a printed wiring board and the improvement of drill life-time, the immersion in a porous sheet such as paper or the like is deficient, the adhesion property with an aluminum substrate is inferior, the coating film itself is further apt to be sticky, the stickiness of coating film surface occurs easily under high humidity conditions such as summer, and trouble in treatment as a product is generated. According to advanced studies by the inventors of the present application, the above-mentioned problems were considerably improved by addition of an inorganic powder filler, but the problem of the absorption of moisture or the stickiness by wetting was an essentially inevitable problem by the prior art in which the main component of coating film is composed of a water-soluble resin.

Additionally, there has been a strong requirement to reduce costs of a printed wiring board under the demand of lowering cost in recent electronic information instruments. Accordingly, there is a requirement to shorten the drilling processing time and increase the number of sheets produced per hour, and it has been necessary to increase the rotational speed of a drill bit, make the processing speed of drilling higher, increase the number of a printed wiring boards which are processed at the same time, and extend the life time of a drill, etc. For these demands, it is required to design to make the quality thereof high, as the patch board for a protective board which is used in a severe condition of drilling processing so as to improve the precision of drilling position and the smoothness of the inner surface of the hole.

SUMMARY OF THE INVENTION

The object of the present invention is to provide a metal plate coated with a lubricating resin being suitable as a patch board for a protective board, wherein the effect of preventing heat generation at the drill bit in drilling, the lubrication effect and the effect of preventing scattering of chips are high, and simultaneously the discharge property of chips is excellent, the drilling processing can be efficiently carried out in high quality, and simultaneously stickiness is not found, in the drilling processing of a printed wiring board by a drill; and drilling processing method of the printed wiring board being used thereof.

The metal plate coated with a lubricating resin according to the first aspect of the present invention comprises: a lubricating resin coating film obtained by coating and curing by heat a resin composition containing a modified polyamide (①) and a crosslinking curing agent (②) of the modified polyamide (①) on at least one side face of the metal plate.

In the metal plate coated with a lubricating resin, the compounding ratio of the above-described modified polyamide (①) and the above-described crosslinking curing agent (②) is preferably ①:②=(60:40) to (85:15) by a mass ratio converted to solid content. In this case, "a mass ratio converted to solid content" means a ratio of mass of each constitutive unit without solvent.

Furthermore, the above-described resin composition preferably contains an inorganic powder filler (③).

Furthermore, the above-described resin coating film preferably contains the resin composition which is composed of a water-soluble lubricant (④) which is composed of an ethylene oxide unit or an ethylene oxide unit and a propylene oxide unit, and a polycarboxylic acid compound (⑤).

Further, the above-described polycarboxylic acid compound (⑤) is preferably a polymer compound containing a carboxyl group in a polymer chain, particularly a polyolefin-based resin containing a carboxyl group.

The above-described resin composition preferably contains at least one kind of modified olefin-based resin (⑥).

The above-described resin composition is selected from a group comprising, for example, a hydrocarbon-based lubricant composed of a liquid paraffin, a paraffin wax, a micro wax, a low polymerization degree polyethylene, a chlorinated hydrocarbon or a fluorocarbon, a fatty acid-based lubricant composed of a higher fatty acid or an oxy fatty acid, a fatty acid amide-based lubricant composed of a fatty acid amide or an alkylene fatty acid amide, an ester-based lubricant composed of a lower alcohol ester of a fatty acid, a polyhydric alcohol ester of a fatty acid, a polyglycol ester of a fatty acid or a fatty alcohol ester of a fatty acid, an alcohol-based lubricant composed of fatty alcohols, a metal soap-based lubricant composed of an alkaline metal salt of a fatty acid having 12 to 18 carbon atoms, a natural wax-based lubricant composed of a carnauba wax, a candelilla wax, a bees wax, an ibota wax or a montan wax, and a mixture thereof, and contains at least one kind of lubricating compound (⑦) having a melting point of a range of 50 to 150° C.

The metal plate coated with a lubricating resin according to the second invention of the present application comprises: a lubricating resin coating film obtained by coating the resin composition which is composed of a water-soluble lubricant (④) which is composed of an ethylene oxide unit or an ethylene oxide unit and a propylene oxide unit, and a polycarboxylic acid compound (⑤), on at least one side face of a metal plate.

In the metal plate coated with a lubricating resin, the above-described resin composition preferably contains an inorganic powder filler (③).

Further, the above-described resin composition preferably contains at least one kind of modified olefin-based resin (⑥).

The above-described resin composition is selected from a group comprising, for example, a hydrocarbon-based lubricant composed of a liquid paraffin, a paraffin wax, a micro wax, a low polymerization degree polyethylene, a chlorinated hydrocarbon or a fluorocarbon, a fatty acid-based lubricant composed of a higher fatty acid or an oxy fatty acid, a fatty acid amide-based lubricant composed of a fatty acid amide or an alkylene fatty acid amide, an ester-based lubricant composed of a lower alcohol ester of a fatty acid, a polyhydric alcohol ester of a fatty acid, a polyglycol ester of a fatty acid or a fatty alcohol ester of a fatty acid, an alcohol-based lubricant composed of fatty alcohols, a metal soap-based lubricant composed of an alkaline metal salt of a fatty acid having 12 to 18 carbon atoms, a natural wax-based lubricant composed of a carnauba wax, a candelilla wax, a bees wax, an ibota wax or a montan wax, and a mixture thereof, and preferably contains at least one kind of lubricating compound (⑦) having a melting point of a range of 50 to 150° C.

The lubricating resin coating film preferably has water-resistance.

The above-described inorganic powder filler (③) shows swelling property to water, is a complex oxide derived from laminar mineral of silicate, and preferably has a crystal structure containing at least silicon, magnesium, fluorine, lithium, and sodium.

It is preferable that the above-described water-soluble lubricant (④) which is composed of an ethylene oxide unit or an ethylene oxide unit and a propylene oxide unit is a polyethylene glycol, and the above-described polycarboxylic acid compound (⑤) is a polyolefin-based resin containing a carboxyl group.

In the present invention, it is preferable that a mold releasing resin composed of a resin composition containing an epoxy-based resin and a silicone-based resin is coated on a face of the above-described metal plate on which the above-described lubricating resin coating film is not coated.

Furthermore, the above-described metal plate is an aluminum alloy plate, and the above-described lubricating resin coating film having a thickness of 5 to 100 μm is preferably formed on at least one face thereof. In this case, the thickness of the above-described aluminum alloy plate is 20 to 400 μm.

The metal plate coated with a lubricating resin of the present invention is used as, for example, a patch board for protection arranged at the proceeding side of a drill of a plurality of printed wiring boards laminated when the small diameter drilling processing is carried out.

The drilling processing method of a printed wiring board according to the present invention comprises the steps of: arranging the metal plate coated with a lubricating resin according to any one of claims 1 to 19 on a face of one or a plurality of printed wiring boards piled to which a drill proceeds, as a patch board for protection; and carrying out drilling by a drill.

DESCRIPTION OF THE PREFERRED EMBODIMENT

The present invention is described in detail below. The metal plate coated with a lubricating resin which is applied to the first drilling processing for a printed wiring board of the present invention is a metal plate in which at least one side face of its surface is coated with a resin composition composed of a mixture in which a modified water-soluble polyamide (①) and a crosslinking curing agent (②) of the modified polyamide (①) are the essential components.

In the above-described resin composition, a thermoplastic resin composition composed of a mixture in which the above-described inorganic powder filler (③) and/or the water-soluble lubricant (④) which is composed of an ethylene oxide unit or an ethylene oxide unit and a propylene oxide unit, and the polycarboxylic acid compound (⑤) are the essential components, and/or the above-described modified olefin-based resin (⑥) and/or the above-described lubricating compound (⑦) may be contained, according to requirement.

The metal plate coated with a lubricating resin which is applied to the second drilling processing for a printed wiring board of the present invention is a metal plate in which at least one side face of its surface is coated with a thermoplastic resin composition composed of a mixture in which the water-soluble lubricant (④) which is composed of an ethylene oxide unit or an ethylene oxide unit and a propylene oxide unit, and the polycarboxylic acid compound (⑤) are the essential components.

In the above-described thermoplastic resin composition, the above-described inorganic powder filler (③) and/or the above-described modified olefin-based resin (⑥) and/or the above-described lubricating compound (⑦) may be contained, according to requirement.

Furthermore, the preferable constitutional ratio shown by a mass ratio converted to solid content is;
①:②=(60:40) to (85:15)
④:⑤=(20:80) to (67:33)
(①+②+④+⑤):③=(70:30) to (100:0)
(①+②+③+④+⑤):⑥=(50:50) to (100:0)
(①+②+③+④+⑤+⑥):⑦=(50:50) to (100:0).

Furthermore, a leveling agent or a defoaming agent may be further compounded in the above-described lubricating resin composition, if necessary, in order to improve coating property to a metal plate.

Furthermore, the lubricating resin coating film formed by coating these resin compositions on a metal plate and curing them by heat is cured by the curing agent (②), and since the ether bonding of the water-soluble lubricant (④) which is composed of an ethylene oxide unit or an ethylene oxide unit and a propylene oxide unit, and the carboxylic group of the polycarboxylic acid compound (⑤) form an aggregate caused by hydrogen bonding, it is characterized in that the water-soluble lubricant (④) which is composed of an ethylene oxide unit or an ethylene oxide unit and a propylene oxide unit, and the polycarboxylic acid compound (⑤) reveal thermoplasticity having a melting point at about 50 to 70° C., do not show solubility in water, and have water-resistance.

Furthermore, "having water-resistance" in the present invention means that the dissolution of the coating film does not occur when the lubricating resin coating film is wetted by water. The coating method to a metal plate is not specifically limited, but a production method such as a gravure coat method or a roll coat method is preferable from the viewpoint of productivity, and the metal plate coated with a lubricating resin having a homogeneous coating thickness after heating and quality without stickiness can be obtained by the method.

The above-described modified polyamide (①) shows solubility in water, and Shore hardness HSD at room temperature is preferably 20 to 40. When the Shore hardness HSD exceeds 40, the hardness of the lubricating resin coating film after heating becomes too high, and the positional precision deteriorates at the time of drilling processing, lubricity at the time of drilling is lowered in particular, therefore a minus effect is imparted from the view point of improvement of a drill life time. On the other hand, when the Shore hardness HSD is less than 20, the hardness and strength of the lubricating resin coating film after heating are insufficient, and the coating film itself happens to be inferior. Accordingly, Shore hardness HSD is preferably 20 to 40.

As the above-described crosslinking curing agent (②), a melamine-based resin such as methylated methylol melamine, a phenol based resin, and a block isocyanate resin and the like are preferable. It is appropriate that the compounding ratio, ①:②, of the modified polyamide (①) and the crosslinking curing agent (②) is (60:40) to (85:15) by a mass ratio converted to solid content. When the addition ratio of the crosslinking curing agent (②) is less than 15, the dissolution and swelling of a coating film at the time of exposure to moisture is apt to occur. On the other hand, when the addition ratio exceeds 40, the flexibility of the coating film is lost and the position precision of a hole at the time of drilling processing is lowered. Accordingly, the compounding ratio, ①:②, is preferably (60:40) to (85:15) by a mass ratio converted to solid content.

The above-described inorganic powder filler (③) is a complex oxide of laminar silicate whose crystal structure is constituted using at least silicon and magnesium as main elements, and kaolinite or halloysite, pyrophilite, talc, montmorillonite, beidellite, saponite, hectorite, vermiculite, muscovite, phlogopite, tetra silicon mica, margarite, or crinanite or the like which naturally exists, is mentioned. In the present invention, metamorphic mica which is constituted by a crystal structure in which silicon, magnesium, fluorine, and sodium are main elements is mentioned as those showing a remarkable effect in the lubricant resin coating film property and the drilling processing property of the above-described lubricating resin. The metamorphic mica which has this crystal structure shows naturally the swelling property to water, and can bestow excellent characteristics below to the swelling resin and the lubricating resin coating film formed after heating. Firstly, it can be homogeneously dispersed in the lubricating resin by being swelled by water, and the control of the optimum viscosity of the resin composition which can be used for production by a gravure coat method or a roll coat method can be carried out. Secondly, the lubricity of the coating film obtained by the combination of the modified polyamide (①) which is mainly contained in the above-described lubricating resin coating film lowers the contact area of a drill at the time of drilling processing by forming a fine uneven structure on the surface of the coating film in addition to the lubricity which the metamorphic mica being the above-described inorganic particle has in nature, the lowering of friction is designed to be obtained, and the more lubricity can be imparted. Thirdly, since the above-described metamorphic mica itself has film forming property, and a good coating film can be obtained at the time of coating. In order to further express the above-described three main effects, the mean particle diameter of the above-described metamorphic mica is preferably 1 to 10 μm, furthermore preferably 2 to 8 μm, and most preferably 3 to 5 μm. When the mean particle diameter of the metamorphic mica is less than 1 μm, the uniformity of dispersion in a mixture of the lubricating resin comes to be lowered. On the other hand, when it exceeds 10 μm, the formation of a fine uneven structure on the surface of the coating film becomes difficult, the effect of lubrication is lowered, and precipitation happens to occur during storage of the mixture of the lubricating resin. Accordingly, the mean particle diameter of the metamorphic mica is preferably 1 to 10 μm.

The above-described water-soluble lubricant (④) which is composed of an ethylene oxide unit or an ethylene oxide unit and a propylene oxide unit is an organic compound having an ether bonding in a molecule. Specifically, aqueous lubricants such as polyethylene glycol, a copolymer of polyethylene glycol and polypropylene glycol, polyoxyethylene alkyl ethers, polyoxyethylene sulfosuccinic acid sodium laurylate, fatty acid esters of polyethylene glycol, fatty acid esters of polyoxyethylene sorbitan, fatty acid esters of polyoxyethylene sorbit, polyoxyethlene polyoxypropylene alkyl ether, polyester polyols or polyether polyols composed of ethylene oxide and propylene oxide, are mentioned, and these alone or a combination thereof may be used. Among these, polyethylene glycol is most preferable. The molecular weight is preferably 750 to 400000, more preferably 3400 to 150000, and most preferably 20000 to 40000. When the molecular weight of the water-soluble lubricant which is composed of an ethylene oxide unit or an ethylene oxide unit and a propylene oxide unit is less than 750, stickiness is apt to occur in the lubricating resin coating film after heating. On the other hand, when the molecular weight of the water-soluble lubricant exceeds 400000, the viscosity of the resin composition becomes markedly high, the leveling property of a coating film at the time of coating is lowered, and workability is lowered. Accordingly, the molecular weight of the water-soluble lubricant composed of an ethylene oxide unit or an ethylene oxide unit and a propylene oxide unit is preferably 750 to 400000.

The above-described polycarboxylic acid compound (⑤) is a high polymer compound containing a carboxyl group in the polymer chain, preferably a polyolefin-based resin containing a carboxyl group, and an ethylene-acrylic acid copolymer, poly acrylic acid and the like can be used. Regarding the water-soluble lubricant (④) which is composed of an ethylene oxide unit or an ethylene oxide unit and a propylene oxide unit, and the polycarboxylic acid compound (⑤), since the ether bonding of the water-soluble lubricant (④) which is composed of an ethylene oxide unit or an ethylene oxide unit and a propylene oxide unit, and the carboxylic group of the polycarboxylic acid compound (⑤) form an aggregate caused by hydrogen bonding, the water-soluble lubricant (④) which is composed of an ethylene oxide unit or an ethylene oxide unit and a propylene oxide unit, and the polycarboxylic acid compound (⑤) show thermoplasticity having a melting point at about 50 to 70° C., do not show solubility in water, and have water-resistance. The above-described aggregate is melted by the friction heat generated at the time of drilling processing by a drill, the melted resin carries out lubrication action at the time of drilling processing, therefore it has a characteristic that the roughness of the inner wall of a hole formed by drilling processing is reduced.

It is appropriate that the compounding ratio, (④:⑤), of the water-soluble lubricant (④) which is composed of an ethylene oxide unit or an ethylene oxide unit and a propylene oxide unit, and the polycarboxylic acid compound (⑤) which is high polymer compound containing a carboxyl group in the molecule is (20:80) to (67:33) by a mass ratio converted to solid content. When the compounding ratio of the water-soluble lubricant (④) is less than 20, the melting point of the aggregate becomes 90° C. or more, it is hardly melted by the friction heat generated at the time of drilling processing by a drill, therefore the lubrication action caused by the melted resin can not be expected. On the other hand, when the above-described polycarboxylic acid compound (⑤) is less than 33, the bonding force of the aggregate caused by hydrogen bonding is lowered and water-resistance is degraded, therefore stickiness is apt to occur on the coating film. Accordingly, the compounding ratio, (④:⑤), of the above-described water-soluble lubricant (④) and the above-described polycarboxylic acid compound (⑤) is preferably (20:80) to (67:33) by a mass ratio converted to solid content.

In the above-described resin composition, the above-described modified olefin-based resin (⑥) may be added in order to improve the adhesion property of the coating film and the metal plate, and additionally, to improve the position precision of a hole at the time of drilling processing. The modified olefin-based resin (⑥) preferably has a Shore hardness HDS of 60 or less, and the adhesion property between the coating film and the metal plate can be improved. As the modified olefin-based resin (⑥), a crystalline olefin-based resin, a polyolefin-based resin, an ethylene-ethyl acrylate copolymer, or an ethylene-vinyl acetate copolymer and the like can be used. Furthermore, the modified olefin-based resin (⑥) is preferably soluble in water-based solvent, or in a form of water-based emulsion.

The preferable compounding ratio, (①+②+③+④+⑤):⑥, of the total of the above-described modified polyamide (①), the above-described crosslinking curing agent (②), the above-described inorganic powder filler (③), the water-soluble lubricant (④), and the polycarboxylic acid compound (⑤), to the above-described modified olefin-based resin (⑥) is (50:50) to (100:0) by a mass ratio converted to solid content. When the addition ratio of the above-described modified olefin-based resin (⑥) exceeds 50, chips generated at the time of drilling processing are melted by heating, and tend to be adhered in through holes and on the substrate, therefore it causes trouble in discharge and elimination of the chips, or the chips adhere to the drill and it becomes an obstruction at grounding again. Accordingly, it is desirable that the addition ratio of the above-described modified olefin-based resin (⑥) is 50 or less.

Furthermore, the above-described lubricating compound (⑦) can be added in order to impart more lubricity to the above-described lubricating resin composition. Specific examples of the above-described lubricating compound (⑦) include a liquid paraffin, a paraffin wax, a micro wax, a low polymerization degree polyethylene, a chlorinated hydrocarbon or a fluorocarbon, a fatty acid-based lubricant composed of a higher fatty acid or an oxy fatty acid, a fatty acid amide-based lubricant composed of a fatty acid amide or an alkylene fatty acid amide, an ester-based lubricant composed of a lower alcohol ester of a fatty acid, a polyhydric alcohol ester of a fatty acid, a polyglycol ester of a fatty acid or a fatty alcohol ester of a fatty acid, an alcohol-based lubricant composed of fatty alcohols, a metal soap-based lubricant composed of an alkaline metal salt of a fatty acid having 12 to 18 carbon atoms, a natural wax-based lubricant composed of a carnauba wax, a candelilla wax, a bees wax, an ibota wax or a montan wax, and a mixture thereof, and these alone or a mixture thereof may be used. The above-described lubricating compound (⑦) expresses its function more by melting due to the friction heat generated at the time of drilling processing by a drill, those having a melting point at a range of 50 to 150° C. and more preferably 50 to 90° C. are suitable as a lubricant. When the lubricating compound (⑦) having a melting point which exceeds 90° C. is used, it is hardly melted by the friction heat generated at the time of drilling processing by a drill, therefore an action as a solid lubricant can be expected, but the action caused by the melted lubricant is hardly expected, and the effect is reduced by half. On the other hand, when the melting point is less than 50° C., it causes stickiness of the coating film in summer and the like in particular, therefore it is not preferable.

The preferable compounding ratio, (①+②+③+④+⑤+⑥):⑦, of the total of the above-described modified polyamide (①), the above-described crosslinking curing agent (②), the above-described inorganic powder filler (③), the water-soluble lubricant (④) which is composed of an ethylene oxide unit or an ethylene oxide unit and a propylene oxide unit, the polycarboxylic acid compound (⑤), and the above-described modified olefin-based resin (⑥), to the above-described lubricating compound (⑦) is (50:50) to (100:0) by a mass ratio converted to solid content. When the addition ratio of the above-described lubricating compound (⑦) exceeds 50, chips generated at the time of drilling processing are melted by heating, and tend to be adhered in through holes and on the substrate, therefore it causes trouble in discharge and elimination of the chips, or the chips adhere to the drill and it becomes an obstruction at grounding again. Accordingly, it is desirable that the addition ratio of the above-described lubricating compound (⑦) is 50 or less.

Furthermore, a leveling agent or a defoaming agent can be appropriately added for further imparting coating properties to the metal plate in the above-described lubricating resin composition, if necessary.

As a means of coating the lubricating resin composition of the present invention on the metal plate and forming a coating film, a gravure coat method or a roll coat method is preferable from the viewpoint of productivity. The lubricating resin composition coated on the metal plate by such a method is baked in a range of 140 to 250° C. and preferably 160 to 200° C. for 5 to 120 seconds and preferably 10 to 60 seconds to be dried, and a coating film having a coating thickness of 5 to 100 $\mu$m and preferably 10 to 50 $\mu$m is formed on the metal plate. When the heating cure temperature is less than 140, the proceeding of the crosslinking reaction o is markedly slow, when the heating cure temperature exceeds 250° C., the crystal structure of the metal plate changes and the strength is lowered when the metal plate is an aluminum substrate. Accordingly, the heating cure temperature is preferably 140 to 250° C.

The preferable thickness of the lubricating resin coating film is 5 to 100 μm. When the thickness of the coating film is less than 5 μm, lubrication property is not revealed, and when the coating film exceeding 100 μm is formed, coating is difficult and productivity is remarkably lowered because the viscosity of the resin composition must be extremely increased by the above-mentioned two methods.

An aluminum substrate is preferably used as the metal plate. Specifically, there are pure aluminum-based substrate and aluminum alloys such as 3000-based and 5000-based alloy and the like, but the pure aluminum-based substrate is most preferable. The thickness of the aluminum substrate is preferably 20 to 400 μm, more preferably 50 to 250 μm and most preferably 100 to 200 μm. When the thickness of the aluminum substrate is less than 20 μm, the handling property as a patch board becomes worse, and the positional precision of the hole of a drill at the time of drilling processing is lowered. Furthermore, when the thickness of the aluminum substrate exceeds 400 μm, the productivity by the above-mentioned two methods is limited, and it becomes inferior from the view point of economic property.

Furthermore, for the metal plate coated with a lubricating resin, a mold releasing resin composition comprising a resin composition containing a silicone-based resin which is disclosed in Japanese Patent Application Publication No. 4–9 may be coated on the face on which the lubricating resin coating film is not carried out, with a thickness of about 0.5 to 10 μm and further preferably about 1 to 5 μm.

Furthermore, the ratio of the plate thickness T of the metal plate of the aluminum substrate and the like and the thickness tr of the lubricating resin coating film may be appropriately selected in accordance with drilling conditions and the like, but in case of tr/T≦0.5, the strain of the metal plate caused by the stress of the lubricating resin coating film becomes minimal, and flatness is improved, therefore an excellent effect of further improving the precision of the drilling processing is obtained. Furthermore, it can be made as an aluminum raw material by melting as it is without peeling the lubricating resin coating film from the metal plate of the aluminum substrate and the like, by setting tr/T≦0.5, and the disposal treatment after using it as the patch board for protection is unnecessary, therefore a preferable effect from the viewpoint of the environment is also obtained.

Then, the drilling processing method of the printed wiring board using the metal plate coated with a lubricating resin of the present invention is illustrated. The drilling processing method of the printed wiring board of the present invention is carried out by piling up one or a plurality of the printed wiring boards and arranging the metal plate coated with a lubricating resin of the present invention on the face to which a drill proceeds. The drilling processing method of the printed wiring board is carried out by performing the cutting processing of the metal plate coated with a lubricating resin by a drill and penetrating it.

When a thermoplastic component is contained in the lubricating resin of the metal plate coated with a lubricating resin, friction heat generated from the drilling processing is absorbed by the melting of the lubricating resin, and simultaneously the melted lubricating resin adheres to the drill, and accompanies it in accordance with the proceeding of the drill, therefore the friction at the time of drilling processing is reduced. Thus, cracks can be prevented from occurring in glass fiber, phenol resin, epoxy resin, copper foil, or paper or the like which is the main constitutional component of the printed wiring boards, and severe damage occurs, under the severe drilling processing conditions which have been recently required in particular. Therefore, the abrasion of the drill is reduced, and simultaneously through hole in which the inner wall of hole after the drilling processing is smooth is obtained.

As described in detail above, according to the present invention, the metal plate coated with a lubricating resin film obtained by forming the resin composition of the present invention on the metal plate composed of aluminum and the like as a coating film has an excellent hole positional precision, inner wall roughness, stickiness of the coating film, and water resistance, and can be adequately applied as a patch board at the time of drilling processing of the printed wiring board. Furthermore, the coating film of the lubricating resin composition of the present invention can be formed by a gravure coat method or a roll coat method which is advantageous from the point of productivity, and furthermore, since the coating film formed by heating in a short time is not substantially soluble in water, stickiness does not occur even if it is exposed under high humidity conditions, and even when the coating film once formed on a metal plate is wound up in the form of a roll, then loaded, and unwounded again from the roll, the transcription of the coating film and stable performance can be retained over a long period.

EXAMPLES

The effects of Examples of the present invention are illustrated below in comparison with Comparative Examples which deviate from the scope of the present invention.

Example 1

16.0% By mass of water soluble modified polyamide, 4.0% by mass of a blocked isocyanate-based as a crosslinking cure agent, 3.2% by mass of a water swelling metamorphic mica as an inorganic powder filler, and 0.3% by mass of a fluorine-based leveling were dispersed at about 40° C. with distilled water to uniformity to be dissolved. The lubricating resin composition was coated on one face of a pure aluminum-based (1050-H18) sheet having a thickness of 150 μm by a roll coat method, cured by heating at 180° C. for 30 seconds, and a lubricating resin coating film with about 25 μm was formed on the aluminum substrate.

Examples 2 to 61

Lubricating resin coating films of about 25 μm thickness were formed on an aluminum substrate by preparing the lubricating resin compositions shown in Table 1 and Table 2 described below according to Example 1, and coating them on the aluminum substrate and carrying out curing by heating.

Comparative Examples 62 to 76

Lubricating resin coating films of about 25 μm thickness were formed on an aluminum substrate by preparing the lubricating resin compositions shown in Table 3 described below according to Example 1 to 61, and coating them on the aluminum substrate and carrying out curing by heating.

TABLE 1

(Compounding ratio of resin composition (unit: % by mass))

| | No | ① Polyamide | ② Curing agent | ③ Inorganic filler | ④ Water soluble lubricant | ⑤ Carboxylic acid compound | ⑥ Olefin | ⑦ Lubricating compound | Others Surfactant |
|---|---|---|---|---|---|---|---|---|---|
| Example | 1 | A) 16.0 | B) 4.0 | 0 | 0 | 0 | 0 | 0 | M) 0.3 |
| | 2 | A) 17.0 | B) 3.0 | 0 | 0 | 0 | 0 | 0 | M) 0.3 |
| | 3 | A) 12.0 | B) 8.0 | 0 | 0 | 0 | 0 | 0 | M) 0.3 |
| | 4 | A) 16.0 | B) 4.0 | E) 3.2 | 0 | 0 | 0 | 0 | M) 0.3 |
| | 5 | A) 17.0 | B) 3.0 | E) 3.2 | 0 | 0 | 0 | 0 | M) 0.3 |
| | 6 | A) 12.0 | B) 8.0 | E) 3.2 | 0 | 0 | 0 | 0 | M) 0.3 |
| | 7 | A) 12.0 | C) 8.0 | E) 3.2 | 0 | 0 | 0 | 0 | 0 |
| | 8 | A) 12.0 | D) 8.0 | E) 3.2 | 0 | 0 | 0 | 0 | 0 |
| | 9 | A) 12.0 | B) 3.0 | 0 | R) 5.0 | F) 5.0 | 0 | 0 | M) 0.3 |
| | 10 | A) 12.0 | B) 3.0 | E) 2.0 | R) 5.0 | F) 5.0 | 0 | 0 | M) 0.3 |
| | 11 | A) 12.0 | B) 3.0 | E) 2.0 | R) 5.0 | F) 10.0 | 0 | 0 | M) 0.3 |
| | 12 | A) 12.0 | B) 3.0 | E) 2.0 | S) 3.0 | F) 12.0 | 0 | 0 | M) 0.3 |
| | 13 | A) 12.0 | B) 3.0 | E) 2.0 | R) 10.0 | F) 5.0 | 0 | 0 | M) 0.3 |
| | 14 | A) 12.0 | B) 3.0 | E) 2.0 | T) 2.0 | F) 2.0 | 0 | 0 | M) 0.3 |
| | 15 | A) 8.0 | B) 2.0 | E) 1.5 | R) 12.0 | F) 12.0 | 0 | 0 | 0 |
| | 16 | A) 16.0 | B) 4.0 | 0 | 0 | 0 | G) 4.0 | 0 | M) 0.3 |
| | 17 | A) 12.0 | B) 3.0 | 0 | R) 5.0 | F) 5.0 | G) 5.0 | 0 | M) 0.3 |
| | 18 | A) 12.0 | B) 3.0 | E) 2.0 | R) 4.0 | F) 4.0 | G) 8.0 | 0 | M) 0.3 |
| | 19 | A) 8.0 | B) 2.0 | E) 1.5 | R) 3.5 | F) 3.5 | G) 15.0 | 0 | 0 |
| | 20 | A) 12.0 | B) 3.0 | E) 3.2 | 0 | 0 | F) 5.0 | 0 | M) 0.3 |
| | 21 | A) 8.0 | B) 2.0 | E) 3.2 | 0 | 0 | F) 13.0 | 0 | M) 0.3 |
| | 22 | A) 9.6 | B) 2.4 | E) 3.2 | 0 | 0 | G) 8.0 | 0 | M) 0.3 |
| | 23 | A) 9.6 | B) 2.4 | E) 3.2 | 0 | 0 | H) 8.0 | 0 | M) 0.3 |
| | 24 | A) 9.6 | B) 2.4 | E) 3.2 | 0 | 0 | I) 8.0 | 0 | M) 0.3 |
| | 25 | A) 12.8 | B) 3.2 | E) 3.2 | 0 | 0 | J) 4.0 | 0 | M) 0.3 |
| | 26 | A) 9.6 | B) 2.4 | 0 | 0 | 0 | 0 | U) 3.0 | M) 0.3 |
| | 27 | A) 9.6 | B) 2.4 | E) 2.0 | 0 | 0 | 0 | V) 10 | M) 0.3 |
| | 28 | A) 9.6 | B) 2.4 | E) 2.0 | 0 | 0 | 0 | V) 2.5 | M) 0.3 |
| | 29 | A) 9.6 | B) 2.4 | E) 2.0 | R) 3.0 | F) 4.0 | G) 6.0 | V) 2.0 | M) 0.3 |
| | 30 | A) 9.6 | B) 2.4 | E) 2.0 | R) 3.0 | F) 4.0 | G) 6.0 | W) 2.0 | 0 |

TABLE 2

(Compounding ratio of resin composition (unit: % by mass))

| | No | ① Polyamide | ② Curing agent | ③ Inorganic filler | ④ Water soluble lubricant | ⑤ Carboxylic acid compound | ⑥ Olefin | ⑦ Lubricating compound | Others Surfactant |
|---|---|---|---|---|---|---|---|---|---|
| Example | 31 | A) 9.6 | B) 2.4 | E) 2.0 | R) 3.0 | F) 3.0 | G) 6.0 | U) 4.0 | 0 |
| | 32 | A) 9.6 | B) 2.4 | E) 2.0 | 0 | 0 | G) 6.0 | W) 8.0 | M) 0.3 |
| | 33 | A) 9.6 | B) 2.4 | E) 2.0 | 0 | 0 | G) 6.0 | X) 8.0 | M) 0.3 |
| | 34 | A) 8.0 | B) 2.0 | E) 1.5 | R) 2.5 | F) 2.5 | G) 2.5 | V) 10.0 | 0 |
| | 35 | 0 | 0 | 0 | R) 12.0 | F) 12.0 | 0 | 0 | M) 0.3 |
| | 36 | 0 | 0 | 0 | R) 10.0 | F) 15.0 | 0 | 0 | M) 0.3 |
| | 37 | 0 | 0 | E) 2.0 | R) 10.0 | F) 15.0 | 0 | 0 | M) 0.3 |
| | 38 | 0 | 0 | E) 2.0 | R) 10.0 | F) 15.0 | G) 3.0 | 0 | M) 0.3 |
| | 39 | 0 | 0 | E) 2.0 | R) 10.0 | F) 15.0 | G) 3.0 | V) 5.0 | M) 0.3 |
| | 40 | A) 12.0 | B) 3.0 | E) 3.5 | K) 8.0 | 0 | F) 5.0 | 0 | M) 0.3 |
| | 41 | A) 10.0 | B) 2.5 | E) 3.5 | K) 13.0 | 0 | F) 4.0 | 0 | M) 0.3 |
| | 42 | A) 12.0 | B) 3.0 | E) 3.5 | L) 8.0 | 0 | F) 5.0 | 0 | 0 |
| | 43 | A) 13.0 | B) 3.2 | E) 3.5 | K) 6.5 | 0 | F) 5.0 | 0 | M) 0.3 |
| | 44 | A) 8.0 | B) 2.0 | E) 4.5 | 0 | 0 | 0 | 0 | M) 0.3 |
| | 45 | A) 16.0 | B) 4.0 | E) 0.5 | 0 | 0 | 0 | 0 | 0 |
| | 46 | A) 16.0 | B) 4.0 | E) 3.5 | L) 6.5 | 0 | 0 | 0 | M) 0.3 |
| | 47 | A) 16.0 | B) 4.0 | E) 3.5 | K) 10.0 | 0 | 0 | 0 | M) 0.3 |
| | 48 | A) 16.0 | B) 2.0 | E) 3.2 | 0 | 0 | 0 | 0 | M) 0.3 |
| | 49 | A) 10.5 | B) 9.5 | E) 3.2 | 0 | 0 | 0 | 0 | M) 0.3 |
| | 50 | N) 16.0 | B) 4.0 | E) 3.2 | 0 | 0 | 0 | 0 | M) 0.3 |
| | 51 | A) 8.0 | B) 2.0 | E) 3.0 | 0 | 0 | F) 15.0 | 0 | 0 |
| | 52 | A) 16.0 | B) 4.0 | E) 0.25 | 0 | 0 | 0 | 0 | 0 |
| | 53 | A) 8.0 | B) 2.0 | E) 5.0 | 0 | 0 | 0 | 0 | M) 0.3 |
| | 54 | A) 16.0 | B) 4.0 | O) 3.2 | 0 | 0 | 0 | 0 | M) 0.3 |
| | 55 | A) 12.8 | B) 3.2 | E) 3.5 | K) 18.0 | 0 | F) 5.0 | 0 | M) 0.3 |
| | 56 | A) 13.0 | B) 3.2 | E) 3.5 | K) 6.5 | 0 | F) 5.0 | 0 | M) 0.3 |
| | 57 | A) 12.0 | B) 3.0 | 0 | R) 5.0 | Y) 5.0 | 0 | 0 | M) 0.3 |
| | 58 | A) 12.0 | B) 3.0 | E) 2.0 | R) 5.0 | Y) 5.0 | 0 | 0 | M) 0.3 |
| | 59 | A) 12.0 | B) 3.0 | E) 2.0 | R) 5.0 | Y) 10.0 | 0 | 0 | M) 0.3 |

TABLE 2-continued (Compounding ratio of resin composition (unit: % by mass))

| No | ① Polyamide | ② Curing agent | ③ Inorganic filler | ④ Water soluble lubricant | ⑤ Carboxylic acid compound | ⑥ Olefin | ⑦ Lubricating compound | Others Surfactant |
|---|---|---|---|---|---|---|---|---|
| 60 | 0 | 0 | E) 1.5 | S) 3.0 | F) 15.0 | 0 | 0 | M) 0.3 |
| 61 | 0 | 0 | E) 2.0 | R) 20.0 | F) 4.0 | 0 | 0 | M) 0.3 |

TABLE 3

(Compounding ratio of resin composition (unit: % by mass))

| | No | ① Polyamide | ② Curing agent | ③ Inorganic filler | ④ Water soluble lubricant | ⑤ Carboxylic acid compound | ⑥ Olefin | ⑦ Lubricating compound | Others Surfactant |
|---|---|---|---|---|---|---|---|---|---|
| Comparative Example | 62 | A) 16.0 | 0 | E) 3.2 | 0 | 0 | 0 | 0 | M) 0.3 |
| | 63 | A) 16.0 | 0 | E) 3.2 | 0 | 0 | F) 5.0 | 0 | M) 0.3 |
| | 64 | A) 16.0 | 0 | E) 3.2 | K) 5.0 | 0 | 0 | 0 | 0 |
| | 65 | A) 14.0 | 0 | E) 3.0 | K) 5.0 | 0 | F) 5.0 | 0 | 0 |
| | 66 | 0 | 0 | 0 | R) 20.0 | 0 | 0 | 0 | M) 0.3 |
| | 67 | 0 | 0 | E) 3.0 | R) 20.0 | 0 | 0 | 0 | 0 |
| | 68 | 0 | 0 | 0 | R) 10.0 T) 4.0 | 0 | 0 | 0 | M) 0.3 |
| | 69 | A) 10.0 | 0 | E) 3.0 | R) 10.0 | 0 | 0 | 0 | M) 0.3 |
| | 70 | 0 | B) 3.0 | E) 3.2 | 0 | 0 | 0 | 0 | P) 15.0 |
| | 71 | 0 | B) 3.0 | E) 3.2 | 0 | 0 | F) 15.0 | 0 | 0 |
| | 72 | 0 | B) 3.0 | E) 3.2 | 0 | 0 | G) 15.0 | 0 | 0 |
| | 73 | 0 | B) 3.0 | E) 3.2 | 0 | 0 | 0 | 0 | Q) 15.0 |
| | 74 | 0 | B) 3.0 | E) 3.2 | 0 | 0 | 0 | 0 | R) 15.0 |
| | 75 | 0 | 0 | 0 | 0 | F) 25.0 | 0 | 0 | 0 |
| | 76 | 0 | 0 | E) 3.0 | 0 | F) 24.3 | 0 | 0 | 0 |

The names of the compounds used in Examples and Comparative Examples (Tables 1 to 3) are shown below.

A) Modified polyamide (Water soluble Nylon resin: Shore hardness HSD 33)
B) Crosslinking curing agent (Blocked isocyanate-crosslinking agent)
C) Crosslinking curing agent (Phenol-based crosslinking agent)
D) Crosslinking curing agent (Methylol melamine-based crosslinking agent)
E) Inorganic powder filler (Water swelling synthesis mica: average particle size=1 to 5 $\mu$m)
F) Modified olefin-based resin; polycarboxylic acid compound (Ethylene-acrylic acid copolymer emulsion)
G) Modified olefin-based resin (Polyethylene-based resin emulsion)
H) Modified olefin-based resin (Crystalline polypropylene based resin emulsion)
I) Modified olefin-based resin (Urethane modified polyolefin-based resin emulsion)
J) Modified olefin-based resin (High crystalline polyethylene-based resin emulsion)
K) Water soluble lubricant (Polyether polyol: molecular weight=3400)
L) Water soluble lubricant (Polyether polyol: molecular weight=750)
M) Leveling agent (Fluorine-based surfactant)
N) Modified polyamide (Water soluble nylon resin: Shore hardness HSD=80)
O) Inorganic powder filler (Non water swelling synthesis mica: average particle size=1 to 5 $\mu$m)
P) Water soluble lubricant (polyvinyl alcohol: polymerization degree=500 to 600, saponification degree=88%)
Q) Water soluble lubricant (Carboxymethyl cellulose sodium salt: polymerization degree=200 to 400)
R) Water soluble lubricant (polyethylene glycol: average molecular weight=20000)
S) Water soluble lubricant (polyethylene glycol: average molecular weight=40000)
T) Water soluble lubricant (polyethylene glycol: average molecular weight=150000 to 400000)
U) Lubricating compound (stearic acid-based lubricant: melting point=52° C.)
V) Lubricating compound (paraffin wax-based lubricant: melting point=61° C.)
W) Lubricating compound (carnauba wax-based lubricant: melting point=83° C.)
X) Lubricating compound (zinc stearate-based lubricant: melting point=120° C.)
Y) Polycarboxylic acid compound (polyacrylic acid: polymerization degree=300 to 400)

The metal plate coated with a lubricating resin prepared according to conditions of Examples and Comparative Examples above was used as a patch board at the time of drilling processing of the printed wiring board, and the performance was evaluated.

The evaluation methods of the performance are shown as described below. Firstly, the drilling processing of the printed wiring board is carried out according to the conditions described in 1) and 2) described below, the performance was evaluated by the hole positional precision and inner wall roughness, and the stickiness of the coating film and water resistance which are described in 3 to 6. The results are shown in Tables 4 to 6 described below.

1) Conditions of Drilling Processing

Condition 1
  Drill bit: diameter of 0.2 mm
  Rotational speed: 100000 rpm
  Feeding speed: 1.4 m/min.
  Drill hit number: 3000 hit Condition 2
  Drill bit: diameter of 0.3 mm
  Rotational speed: 150000 rpm
  Feeding speed: 2.5 m/min.
  Drill hit number: 3000 hit 2) Arranging Method at Drilling Processing A copper foil-laminated printed wiring board having a thickness of 0.2 mm was placed under the metal plate coated with a lubricating resin by piling up 8 sheets of the board, and a back-up board composed of a Bakelite board having a thickness of 1.5 mm is arranged under thereof to be provided for the drilling processing.

3) Judgment Method of Hole Positional Precision

The judgment of the hole positional precision was carried out concerning the lowest board (8$^{th}$ sheet) among the 8-piled printed wiring board after 3000 hits. In the lowest board, those in which the standard deviation of error interval from the central part of holes is less than 12.5 μm were evaluated as ◎, those in which it is less than 15 μm were evaluated as ○, those in which it is less than 17.5 μm were evaluated as Δ, and those in which it is 17.5 μm or more were evaluated as X.

4) Judgment Method of Inner Wall Roughness

The judgment of the inner wall roughness was carried out by measuring the inner wall roughness of the left and right of the respective through hole by every two holes at, before and after 2000 hits. Those in which the average value was less than 12.5 μm were evaluated as ◎, those in which it was less than 15 μm were evaluated as ○, those in which it was less than 17.5 μm were evaluated as Δ, and those in which it exceeded 17.5 μm were evaluated as X.

5) Judgment Method of Stickiness of Coating Film

On the metal plate coated with a lubricating resin which was cut into a square having longitudinal and horizontal lengths of 5 cm, an aluminum plate (having no coating film) having the same form was piled up so as to be in contact with the lubricating coating film, a load of 50 kg was mounted on the piled plates, and it was stood alone under conditions of 40° C. and relative humidity of 90% for 12 hours. Those in which the transcription of the lubricating resin coating film was not confirmed were evaluated as ○, those in which the transcription occurred slightly were evaluated as Δ, and those in which the transcription of the lubricating coating film occurred clearly were evaluated as X.

6) Judgment Method of Water Resistance of Coating Film

Distilled water was sprayed on the metal plate coated with a lubricating resin by a sprayer, and it was stood alone at room temperature for 5 minutes in a condition in which the lubricating resin coating film was wet with water. When the coating film was softly rubbed by a nail, those in which scratch and the like did not occur on the coating film were evaluated as ◎, those in which a visual change in the coating film occurred slightly were evaluated as ○, those in which the coating film was dissolved slightly were evaluated as Δ, and those in which the coating film was dissolved completely and the texture of the metal was exposed were evaluated as X.

TABLE 4

(Evaluation result of Example)

| No. | Evaluation method | Hole positional Precision | Inner wall roughness | Stickiness of coating | Water resistance of coating film |
|---|---|---|---|---|---|
| Example | | | | | |
| 1 | Condition 2 | ○ | ○ | Δ | ○ |
| 2 | Condition 2 | ○ | ○ | Δ | Δ |
| 3 | Condition 2 | Δ | ○ | ○ | ○ |
| 4 | Condition 1 | ○ | ○ | ○ | ◎ |
| 5 | Condition 1 | ◎ | ○ | ○ | ○ |
| 6 | Condition 1 | ○ | ○ | ○ | ◎ |
| 7 | Condition 1 | ◎ | ○ | ○ | ◎ |
| 8 | Condition 1 | ◎ | ○ | ○ | ○ |
| 9 | Condition 2 | ○ | ◎ | ○ | ○ |
| 10 | Condition 2 | ◎ | ◎ | ○ | ○ |
| 11 | Condition 2 | ○ | ◎ | ○ | ◎ |
| 12 | Condition 2 | ○ | ◎ | ○ | ◎ |
| 13 | Condition 2 | ○ | ◎ | Δ | ○ |
| 14 | Condition 2 | ○ | ○ | ○ | ○ |
| 15 | Condition 2 | ○ | ◎ | Δ | Δ |
| 16 | Condition 2 | ○ | ○ | ○ | ○ |
| 17 | Condition 2 | ○ | ◎ | ○ | ○ |
| 18 | Condition 2 | ◎ | ◎ | ○ | ◎ |
| 19 | Condition 2 | ○ | ○ | ○ | ◎ |
| 20 | Condition 1 | ◎ | ◎ | ○ | ◎ |
| 21 | Condition 1 | ◎ | ○ | ○ | ◎ |
| 22 | Condition 1 | ◎ | ○ | ○ | ◎ |
| 23 | Condition 1 | ◎ | ○ | ○ | ◎ |
| 24 | Condition 1 | ○ | ○ | ○ | ◎ |
| 25 | Condition 1 | ○ | ○ | ○ | ◎ |
| 26 | Condition 2 | ○ | ◎ | Δ | ◎ |
| 27 | Condition 2 | ○ | ◎ | ○ | ◎ |
| 28 | Condition 2 | ○ | ◎ | ○ | ◎ |
| 29 | Condition 2 | ○ | ◎ | ○ | ◎ |
| 30 | Condition 2 | ○ | ◎ | ○ | ◎ |

TABLE 5

(Evaluation result of Example)

| No. | Evaluation method | Hole Positional Precision | Inner wall roughness | Stickiness of coating film | Water resistance of coating |
|---|---|---|---|---|---|
| Example | | | | | |
| 31 | Condition 2 | ○ | ◎ | Δ | ◎ |
| 32 | Condition 2 | ○ | ◎ | ○ | ◎ |
| 33 | Condition 2 | ○ | ○ | ○ | ◎ |
| 34 | Condition 2 | ○ | ◎ | ○ | ◎ |
| 35 | Condition 2 | ○ | ◎ | Δ | Δ |
| 36 | Condition 2 | ○ | ◎ | ○ | ○ |
| 37 | Condition 2 | ◎ | ◎ | ○ | ○ |
| 38 | Condition 2 | ◎ | ◎ | ○ | ○ |
| 39 | Condition 2 | ◎ | ◎ | ○ | ○ |
| 40 | Condition 1 | ◎ | ◎ | ○ | ◎ |
| 41 | Condition 1 | ◎ | ◎ | ○ | ○ |
| 42 | Condition 1 | ◎ | ◎ | ○ | ◎ |
| 43 | Condition 1 | ◎ | ◎ | ○ | ◎ |
| 44 | Condition 1 | ○ | ○ | ○ | ○ |
| 45 | Condition 1 | ○ | ○ | ○ | ○ |
| 46 | Condition 1 | ○ | ◎ | ○ | ○ |
| 47 | Condition 1 | ○ | ◎ | ○ | ○ |
| 48 | Condition 1 | ○ | ○ | ○ | Δ |
| 49 | Condition 1 | Δ | ○ | ○ | ◎ |
| 50 | Condition 1 | Δ | Δ | ○ | ◎ |
| 51 | Condition 1 | ◎ | Δ | ○ | ○ |
| 52 | Condition 1 | Δ | ○ | Δ | Δ |
| 53 | Condition 1 | Δ | ○ | ○ | ○ |
| 54 | Condition 1 | Δ | Δ | ○ | ○ |

TABLE 5-continued (Evaluation result of Example)

| No. | Evaluation method | Hole Positional Precision | Inner wall roughness | Stickiness of coating film | Water resistance of coating |
|---|---|---|---|---|---|
| 55 | Condition 1 | ⊚ | ⊚ | △ | ○ |
| 56 | Condition 1 | ⊚ | ⊚ | ○ | ⊚ |
| 57 | Condition 2 | △ | △ | △ | ○ |
| 58 | Condition 2 | △ | ○ | △ | ○ |
| 59 | Condition 2 | △ | ○ | △ | ○ |
| 60 | Condition 2 | △ | ○ | ○ | ○ |
| 61 | Condition 2 | △ | ○ | ○ | ○ |

TABLE 6

(Evaluation result of Comparative Example)

| No. | Evaluation method | Hole positional Precision | Inner wall roughness | Stickiness of coating | Water resistance of coating |
|---|---|---|---|---|---|
| Comparative Example | | | | | |
| 62 | Condition 1 | ○ | ○ | ○ | X |
| 63 | Condition 1 | ⊚ | ○ | ○ | X |
| 64 | Condition 1 | ○ | ⊚ | ○ | X |
| 65 | Condition 1 | ⊚ | ⊚ | ○ | X |
| 66 | Condition 2 | ○ | ○ | X | X |
| 67 | Condition 2 | ⊚ | ⊚ | X | X |
| 68 | Condition 2 | ○ | ○ | X | X |
| 69 | Condition 2 | ⊚ | ⊚ | X | X |
| 70 | Condition 1 | X | △ | ○ | ○ |
| 71 | Condition 1 | X | ○ | ○ | ○ |
| 72 | Condition 1 | X | ○ | ○ | ○ |
| 73 | Condition 1 | X | X | ○ | △ |
| 74 | Condition 1 | ○ | ○ | △ | X |
| 75 | Condition 2 | X | △ | △ | ○ |
| 76 | Condition 2 | X | ○ | ○ | ○ |

As shown in the above-mentioned Table 4 and Table 5, the effect of improving the marked improvement of performance was confirmed in Examples 1 to 61 included in the scope of the invention of the present application, regarding the hole positional precision at the time of drilling processing by a drill, the inner wall roughness of through holes, the transcription behavior caused by moisture absorption of the lubricating coating film which was formed on an aluminum substrate, and the water resistance of the lubricating coating film.

The lubricating resin components of Examples 1 to 3 are constituted by ((1)) and ((2)). These showed appropriate performance only when the drilling processing was carried out under the condition 2.

The lubricating resin components of Examples 4 to 8 are constituted by ((1)), ((2)) and ((3)). Furthermore, the lubricating resin components of Examples 6 to 8 are Examples in which the kind of the crosslinking curing agent ((2)) is changed. The lubricating resin component of Example 9 is constituted by ((1)), ((2)), ((4)) and ((5)). The lubricating resin components of Examples 10 to 15 are constituted by those in which ((4)) and ((5)) are added to ((1)), ((2)) and ((3)). The lubricating resin component of Example 16 is constituted by ((1)), ((2)) and ((6)). The lubricating resin component of Example 17 is constituted by ((1)), ((2)), ((4)), ((5)) and ((6)), the lubricating resin components of Examples 18 and 19 are constituted by those in which ((6)) is added to ((1)), ((2)), ((3)), ((4)) and ((5)), and the lubricating resin components of Examples 20 to 25 are constituted by those in which ((6)) is added to ((1)), ((2)) and ((3)). The lubricating resin component of Examples 26 is constituted by ((1)), ((2)) and ((7)).

The lubricating resin components of Examples 27 and 28 are constituted by ((1)), ((2)), ((3)) and ((7)). The lubricating resin components of Examples 29 to 31 and Example 34 are constituted by ((1)), ((2)), ((3)), ((4)), ((5)), ((6)) and ((7)). The lubricating resin components of Examples 32 and 33 are constituted by ((1)), ((2)), ((3)), ((6)) and ((7)). The lubricating resin components of Examples 35 and 36 are constituted by ((4)) and ((5)). The lubricating resin component of Example 37 is constituted by ((3)), ((4)) and ((5)). The lubricating resin component of Example 38 is constituted by those in which ((6)) is added to ((3)), ((4)) and ((5)). The lubricating resin component of Example 39 is constituted by those in which ((6)) and ((7)) are added to ((3)), ((4)) and ((5)). The lubricating resin components of Examples 40 to 43 are constituted by those in which ((4)) and ((6)) are added to ((1)), ((2)) and ((3)). The lubricating resin component of Examples 44 and 45 are constituted by ((1)), ((2)) and ((3)). The lubricating resin components of Examples 46 and 47 are constituted by those in which ((4)) is added to ((1)), ((2)) and ((3)).

Furthermore, (B) as the crosslinking curing agent ((2)), (E) as the inorganic powder filler ((3)), (F) as the modified olefin-based resin ((6)) and/or the polycarboxylic acid compound ((5)), and (K) and/or (S) as the water-soluble lubricant ((4)) are preferable.

The lubricating resin component of Example 48 is ((1))+((2))+((3)), but since the compounding ratio of the crosslinking curing agent ((2)) is less than the lower limit value of the preferable scope of the present invention, the coating film showed slight water solubility. The lubricating resin component of Example 49 is ((1))+((2))+((3)), but since the compounding ratio of the crosslinking curing agent ((2)) exceeds the upper limit value of the preferable scope of the present invention, the hole positional precision at the time of drilling processing was slightly lowered. The lubricating resin component of Example 50 is ((1))+((2))+((3)), and the compounding ratio is within the preferable scope of the present invention, but since a hard polyamide was used, the hole positional precision is slightly lowered. Furthermore, the inner wall roughness was also lowered. The lubricating resin component of Example 51 is ((1))+((2))+((3))+((6)), but since the compounding ratio of the polyolefin ((6)) exceeds the upper limit value of the preferable scope of the present invention, the removal property of chips was slightly lowered. The lubricating resin component of Example 52 is ((1))+((2))+((3)), but since the compounding ratio of the inorganic powder filler ((3)) is negligibly small, the hole positional precision was slightly lowered when the drilling processing was carried out at the condition 1. Furthermore, the inner wall roughness and the water resistance of the coating film were slightly lowered. The lubricating resin component of Example 53 is ((1))+((2))+((3)), but since the compounding ratio of the inorganic powder filler ((3)) exceeds the upper limit value of the preferable scope of the present invention, the viscosity of the resin composition is raised, coating to the metal plate becomes difficult, and the surface of the lubricating resin coating film becomes slightly rough, therefore the hole positional precision is slightly lowered. The lubricating resin component of Example 54 is ((1))+((2))+((3)), but since the inorganic powder filler ((3)) is a material not revealing the swelling property to water, the dispersion of filler is not good, the surface becomes slightly rough, therefore the hole positional precision and the inner wall roughness were slightly lowered. The lubricating resin component of Example 55 is (①)+(②)+(③)+(④)+(⑥), but since the compounding ratio of the water-soluble lubricant (④) exceeds the upper limit value of the preferable scope of the present invention, stickiness occurred slightly on the lubricating resin coating film. The lubricating resin component of Example 56 forms a mold releasing resin coating film on the opposite side of the face on which the lubricating resin coating film according to Example 43 is formed, reveals the excellent hole positional precision, the inner wall roughness, and the water resistance, and no stickiness occurred. The lubricating resin component of Example 57 is (①)+(②)+(④)+(⑤) the lubricating resin components of Examples 58 and 59 is (①)+(②)+(③)+(④)+(⑤), but a poly(acrylic acid) is used for the polycarboxylic acid compound (⑤). Accordingly, the excellent hole positional precision, the inner wall roughness, and the stickiness of the coating film are slightly lowered in Example 57. Furthermore, the coating film becomes slightly hard, and the hole positional precision is slightly lowered in Examples 58 and 59. The lubricating resin component of Example 60 is (③)+(④)+(⑤), but since the molecular weight of the water-soluble lubricant exceeds the upper limit value of the preferable scope of the present invention, the viscosity of the resin composition increases, it becomes difficult to coat it on the metal plate, and the surface of the lubricating resin coating film becomes slightly rough, therefore the hole positional precision is slightly lowered. The lubricating resin component of Example 61 is (③)+(④)+(⑤), but since the compounding ratio the water-soluble lubricant (④) exceeds the upper limit value of the preferable scope of the present invention, the water resistance and stickiness of the lubricating resin coating film are slightly lowered.

On the contrary, those satisfying all of a series of performances did not exist in Comparative Examples 62 to 76 described in the above-mentioned Table 6 which were out of the scope of the invention of the present application. The lubricating resin components of Comparative Examples 62 to 65 are (①)+(③), and since the curing agent (②) is not contained, the water resistance was deteriorated in particular. Since the lubricating resin components of Comparative Examples 66 to 69 contain only water-soluble lubricant (④) as a main component and the polycarboxylic acid compound (⑤) is not contained, they are water-soluble and degraded in stickiness and water resistance. The lubricating resin components of Comparative Examples 70 to 74 are (②)+(③), and since the polyamide (①), the water-soluble lubricant (④), and the polycarboxylic acid compound (⑤) are not contained, the desired performances were not obtained. The hole positional precision was deteriorated in Comparative Example 71 and Comparative Example 72, and the water resistance of the coating film was slightly lowered and the hole positional precision and the inner wall roughness were deteriorated in Comparative Example 73. The stickiness of the coating film was slightly lowered and the water resistance of the coating film was slightly lowered in Comparative Example 74. The coating films of Comparative Examples 75 to 76 contain only polycarboxylic acid compound (⑤), as a main component, and the coating film is hard and degraded in hole positional precision.

Accordingly, it was made clear that only the metal plate having the lubricating coating film of the compounding which was prescribed in the technical scope of the invention of the present application reveals excellent performances as the patch board at the time of drilling processing of the printed wiring board.

What is claimed is:

1. A patch board for protecting circuit boards during drilling comprising, a metal plate coated on at least one face with a crosslinked modified polyamide lubricating resin comprising a modified polyamide crosslinked with a crosslinking curing agent, wherein the crosslinked polyamide is soluble in water and has a shore hardness HSD of 20 to 40.

2. The patch board according to claim 1, wherein the lubricating resin is obtained by heating the modified polyamide and the crosslinking curing agent on the metal plate and the compounding ratio of said modified polyamide and said crosslinking curing agent 60:40 to 85:15 by a mass ratio converted to solid content.

3. The patch board according to claim 1, wherein said resin further comprises an inorganic powder filler.

4. The patch board according to claim 3, wherein said inorganic powder filler is swellable in water, is a complex oxide derived from laminar mineral of silicate, and has a crystal structure containing at least silicon, magnesium, fluorine, lithium, and sodium.

5. The patch board according to claim 1, wherein said resin further comprises a water-soluble lubricant which comprises polymerized units of an ethylene oxide unit or an ethylene oxide unit and a propylene oxide unit, and a polycarboxylic acid compound.

6. The patch board according to claim 5, wherein said polycarboxylic acid compound is a polymer having a carboxyl group in a polymer chain.

7. The patch board according to claim 6, wherein said polycarboxylic acid compound is a polyolefin-based resin containing a carboxyl group.

8. The patch board according to claim 5, wherein said water-soluble lubricant comprises polyethylene glycol, and a polyolefin-based resin containing a carboxyl group.

9. The patch board according to claim 1, wherein said resin further comprises at least one modified olefin-based resin.

10. The patch board according to claim 1, wherein said resin further comprises at least one member selected from the group consisting of a hydrocarbon-based lubricant comprising a liquid paraffin, a paraffin wax, a micro wax, a low polymerization degree polyethylene, a chlorinated hydrocarbon, a chlorinated fluorocarbon, a fatty acid-based lubricant comprising a higher fatty acid, a fatty acid-based lubricant comprising an oxy fatty acid, a fatty acid amide-based lubricant comprising a fatty acid amide, a fatty acid amide-based lubricant comprising an alkylene fatty acid amide, an ester based lubricant composed of a lower alcohol ester of a fatty acid, a polyhydric alcohol ester of a fatty acid, a polyglycol ester of a fatty acid, a polyglycol ester of a fatty alcohol ester of a fatty acid, an alcohol-based lubricant comprising fatty alcohols, a metal soap-based lubricant comprising an alkaline metal salt of a fatty acid having 12 to 18 carbon atoms, a natural wax-based lubricant comprising a carnauba wax, a candelilla wax, a bees wax, an ibota wax, a montan wax, and a mixture thereof, and at least one lubricating compound having a melting point of from 50 to 150° C.

11. The patch board according to claim 1, wherein the resin has water-resistance.

12. The patch board according to claim 1, further comprising a mold releasing resin composition comprising a resin composition containing an epoxy-based resin and a silicone-based resin coated on a face of said metal plate on which said resin is not coated.

13. The patch board according to claim 1, wherein said metal plate is an aluminum alloy plate, and said lubricating resin is present as a film having a thickness of 5 to 100 μm.

14. The patch board according to claim 13, wherein the thickness of said aluminum alloy plate is 20 to 400μm.

15. The patch board according to claim 1, wherein it is used as a patch board for protection arranged at the proceeding side of a drill of a plurality of printed wiring boards laminated when the drilling processing of small diameter is carried out.

16. The patch board according to claim 1, wherein the ratio of the thickness of the metal plate and the thickness of the crosslinked modified polyamide lubricating resin coating is less than 0.5.

17. The patch board according to claim 1, wherein the resin further comprises a fluorine-based leveling agent.

18. A patch board for protecting circuit boards during drilling comprising a metal plate coated on at least one face with a resin comprising a water-soluble lubricant which comprises bonded units of one or more of an ethylene oxide unit or an ethylene oxide unit and a propylene oxide unit, and a polycarboxylic acid compound.

19. The patch board according to claim 18, wherein said resin further comprises an inorganic powder filler.

20. The patch board according to claim 19, wherein said inorganic powder filler is swellable in water, is a complex oxide derived from laminar mineral of silicate, and has a crystal structure containing at least silicon, magnesium, fluorine, lithium, and sodium.

21. The patch board according to claim 18, wherein said resin further comprises at least one modified olefin-based resin.

22. The patch board according to claim 18, wherein said resin further comprises at least one member selected from a group consisting of a hydrocarbon-based lubricant comprising a liquid paraffin, a paraffin wax, a micro wax, a low polymerization degree polyethylene, a chlorinated hydrocarbon, a chlorinated fluorocarbon, a fatty acid-based lubricant comprising a higher fatty acid, a fatty acid-based lubricant composed of oxy fatty acid, a fatty acid amide-based lubricant comprising a fatty acid amide, a fatty acid amide-based lubricant comprising an alkylene fatty acid amide, an ester based lubricant comprising a lower alcohol ester of a fatty acid, a polyhydric alcohol ester of a fatty acid, a polyglycol ester of a fatty acid, a polyglycol ester of a fatty alcohol ester of a fatty acid, an alcohol-based lubricant comprising fatty alcohols, a metal soap-based lubricant comprising an alkaline metal salt of a fatty acid having 12 to 18 carbon atoms, a natural wax-based lubricant comprising a carnauba wax, a candelilla wax, a bees wax, an ibota wax, a montan wax, and a mixture thereof, and at least one lubricating compound having a melting point of from 50 to 150° C.

23. The patch board according to claim 18, wherein the resin has water-resistance.

24. The patch board according to claim 18, wherein said water-soluble lubricant comprises polyethylene glycol and a polyolefin-based resin containing a carboxyl group.

25. The patch board according to claim 18, further comprising a mold releasing resin composition comprising a resin composition containing an epoxy-based resin and a silicone-based resin coated on the face of said metal plate on which said lubricating resin is not coated.

26. The patch board according to claim 18 wherein said metal plate is an aluminum alloy plate, and said lubricating resin is present as a film having a thickness of 5 to 100μm.

27. The patch board according to claim 26, wherein the thickness of said aluminum alloy plate is 20 to 400 μm.

28. The patch board according to claim 18, wherein it is used as a patch board for protection arranged at the proceeding side of a drill of a plurality of printed wiring boards laminated when the drilling processing of small diameter is carried out.

29. A drilling processing method of a printed wiring board comprising:
arranging the patch board according to claim 18 on top of a face of one or a plurality of printed wiring boards; and
drilling first through the patch board and then through the printed circuit board.

30. The patch board according to claim 18, wherein the ratio of the thickness of the metal plate and the thickness of the crosslinked modified polyamide lubricating resin coating is less than 0.5.

31. The patch board according to claim 18, wherein the resin further comprises a fluorine-based leveling agent.

32. A drilling processing method of a printed wiring board comprising:
arranging the patch board according to claim 1 on top of a face of one or a plurality of printed wiring boards; and
drilling first through the patch board and then through the printed circuit board.

33. In a patch board for protecting a printed circuit board during drilling of one or more printed circuit boards, wherein the improvement comprises
a patch board comprising a metal sheet coated with a crosslinked modified polyamide lubricating resin comprising a modified polyamide crosslinked with a crosslinking curing agent, wherein the crosslinked polyamide is soluble in water and has a shore hardness HSD of 20 to 40 present on at least one face of the metal plate.

34. The patch board according to claim 33, wherein the lubricating resin is obtained by heating the modified polyamide and the crosslinking curing agent on the metal plate and the compounding ratio of said modified polyamide and said crosslinking curing agent is 60:40 to 85:15 by a mass ratio converted to solid content.

35. The patch board according to claim 33, wherein said resin comprises an inorganic powder filler.

36. The patch board according to claim 33, wherein said resin further comprises a water-soluble lubricant which comprises polymerized units of an ethylene oxide unit or an ethylene oxide unit and a propylene oxide unit, and a polycarboxylic acid compound.

37. The patch board according to claim 36, wherein said polycarboxylic acid compound is a polymer having a carboxyl group in a polymer chain.

38. The patch board according to claim 36, wherein said polycarboxylic acid compound is a polyolefin-based resin containing a carboxyl group.

39. The patch board according to claim 33, wherein said resin further comprises at least one modified olefin-based resin.

40. The patch board according to claim 33, wherein said resin further comprises at least one member selected from the group consisting of a hydrocarbon-based lubricant comprising a liquid paraffin, a paraffin wax, a micro wax, a low polymerization degree polyethylene, chlorinated hydrocarbon, a chlorinated fluorocarbon, a fatty acid-based lubricant comprising a higher fatty acid, a fatty acid-based lubricant comprising an oxy fatty acid, a fatty acid amide-based lubricant comprising a fatty acid amide, a fatty acid amide-based lubricant comprising an alkylene fatty acid amide, an ester based lubricant comprising a lower alcohol ester of a fatty acid, a polyhydric alcohol ester of a fatty acid, a polyglycol ester of a fatty acid, a polyglycol ester of a fatty alcohol ester of a fatty acid, an alcohol-based lubricant comprising fatty alcohols, a metal soap-based lubricant comprising an alkaline metal salt of a fatty acid having 12 to 18 carbon atoms, a natural wax-based lubricant comprising a carnauba wax, a candelilla wax, a bees wax, an ibota wax, a montan wax, and a mixture thereof; and at least one lubricating compound having a melting point of from 50 to 150° C.

41. The patch board according to claim 33, further comprising a mold releasing resin composition comprising a resin composition containing an epoxy-based resin and a silicone based resin coated on the face of said metal plate on which said lubricating resin is not coated.

42. The patch board according to claim 33, further comprising a mold releasing resin composition comprising a resin composition containing an epoxy-based resin and a silicone-based resin coated on the face of said metal plate on which said lubricating resin is not coated.

43. The patch board according to claim 33, wherein said metal plate is an aluminum alloy plate, and said lubricating resin is present as a film having a thickness of 5 to 100 $\mu$m.

44. The patch board according to claim 33, wherein the thickness of said aluminum alloy plate is 20 to 400 $\mu$m.

45. In a patch board for protecting a printed circuit board during drilling, wherein the improvement comprises a metal plate coated on at least one face with a lubricating resin comprising a water soluble lubricant which comprises bonded units of one or more of an ethylene oxide unit or an ethylene oxide unit and a propylene oxide unit, and a polycarboxylic acid compound.

46. The patch board according to claim 45, wherein said resin further comprises an inorganic powder filler.

47. The patch board according to claim 45, wherein said resin further comprises at least one modified olefin-based resin.

48. The patch board according to claim 45, wherein said resin further comprises at least one member selected from the group consisting of a hydrocarbon-based lubricant comprising a liquid paraffin, a paraffin wax, a micro wax, a low polymerization degree polyethylene, chlorinated hydrocarbon, a chlorinated fluorocarbon, a fatty acid-based lubricant comprising a higher fatty acid, a fatty acid-based lubricant comprising an oxy fatty acid, a fatty acid amide-based lubricant comprising a fatty acid amide, a fatty acid amide-based lubricant comprising an alkylene fatty acid amide, an ester based lubricant comprising a lower alcohol ester of a fatty acid, a polyhydric alcohol ester of a fatty acid, a polyglycol ester of a fatty acid, a polyglycol ester of a fatty alcohol ester of a fatty acid, an alcohol-based lubricant composed of fatty alcohols, a metal soap-based lubricant composed of an alkaline metal salt of a fatty acid having 12 to 18 carbon atoms, a natural wax-based lubricant comprising a carnauba wax, a candelilla wax, a bees wax, an ibota wax, a montan wax, and a mixture thereof; and at least one lubricating compound having a melting point of from 50 to 150° C.

49. The patch board according to claim 46, wherein said inorganic powder filler is swellable in water, is a complex oxide derived from laminar mineral of silicate, and has a crystal structure containing at least silicon, magnesium, fluorine, lithium, and sodium.

50. The patch board according to claim 35, wherein said inorganic powder filler is swellable in water, is a complex oxide derived from laminar mineral of silicate, and has a crystal structure containing at least silicon, magnesium, fluorine, lithium, and sodium.

51. The patch board according to claim 45, wherein said water-soluble lubricant comprises polyethylene glycol and a polyolefin-based resin containing a carboxyl group.

52. The patch board according to claim 45, wherein said metal plate is an aluminum alloy plate, and said lubricating resin is present as a film having a thickness of 5 to 100 $\mu$m.

53. The patch board according to claim 45, wherein the thickness of said aluminum alloy plate is 20 to 400 $\mu$m.

* * * * *

UNITED STATES PATENT AND TRADEMARK OFFICE
CERTIFICATE OF CORRECTION

PATENT NO. : 6,794,022 B2
DATED : September 21, 2004
INVENTOR(S) : Fujiwara et al.

It is certified that error appears in the above-identified patent and that said Letters Patent is hereby corrected as shown below:

<u>Title page,</u>
Item [73], Assignee, should read:
-- Kabushiki Kaisha Kobe Seiko Sho (Kobe Steel Ltd.), Kobe (JP);
   Sun Aluminium Industries Co., Ltd., Chiba (JP) --.

Signed and Sealed this

Seventh Day of February, 2006

JON W. DUDAS
*Director of the United States Patent and Trademark Office*